US012224229B2

(12) United States Patent
Tanabiki

(10) Patent No.: US 12,224,229 B2
(45) Date of Patent: Feb. 11, 2025

(54) SEMICONDUCTOR DEVICE WITH GROOVED DIE PAD

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kyo Tanabiki, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 85 days.

(21) Appl. No.: 17/410,508

(22) Filed: Aug. 24, 2021

(65) Prior Publication Data

US 2022/0301983 A1    Sep. 22, 2022

(30) Foreign Application Priority Data

Mar. 16, 2021  (JP) .................................. 2021-042330

(51) Int. Cl.
*H01L 23/495* (2006.01)
*H01L 21/48* (2006.01)
*H01L 23/31* (2006.01)

(52) U.S. Cl.
CPC .... *H01L 23/49503* (2013.01); *H01L 21/4842* (2013.01); *H01L 23/3121* (2013.01); *H01L 23/3142* (2013.01); *H01L 23/49579* (2013.01)

(58) Field of Classification Search
CPC ......... H01L 23/49503–49513; H01L 23/3121; H01L 23/49579
See application file for complete search history.

(56) References Cited

U.S. PATENT DOCUMENTS

| 2003/0003628 | A1  | 1/2003 | Oga et al. |
| 2010/0052149 | A1* | 3/2010 | Nose ................. H01L 23/49513 257/692 |
| 2013/0256851 | A1* | 10/2013 | Noda .................... H01L 23/544 257/667 |

(Continued)

FOREIGN PATENT DOCUMENTS

| CN | 107017218 A | 8/2017 |
| CN | 107924884 A | 4/2018 |

(Continued)

OTHER PUBLICATIONS

Notice of Reasons for Refusal mailed Nov. 20, 2023 in corresponding Japanese Patent Application No. 2021-042330 with machine translation, 10 pages.

(Continued)

*Primary Examiner* — Laura M Menz
*Assistant Examiner* — Candice Chan
(74) *Attorney, Agent, or Firm* — Kim & Stewart LLP

(57) ABSTRACT

According to one embodiment, a semiconductor device includes a frame with a die pad and terminals extending from the die pad in a first direction. A groove is provided in an upper surface of the die pad. A semiconductor element is on the upper surface of the die pad but does not overlap the groove. A resin material covers the semiconductor element and is in the groove. The groove includes a bottom surface with an irregularity therein.

14 Claims, 6 Drawing Sheets

(56) References Cited

U.S. PATENT DOCUMENTS

| | | | |
|---|---|---|---|
| 2014/0001620 A1* | 1/2014 | Shimizu | H01L 24/32 257/676 |
| 2017/0162520 A1 | 6/2017 | Kaneko et al. | |
| 2018/0197802 A1 | 7/2018 | Nagamatsu et al. | |
| 2020/0328132 A1* | 10/2020 | Kobayashi | H01L 23/3142 |

FOREIGN PATENT DOCUMENTS

| | | |
|---|---|---|
| CN | 110544675 A | 12/2019 |
| JP | H043450 A | 1/1992 |
| JP | H04003450 A | 1/1992 |
| JP | 2593912 B2 | 3/1997 |
| JP | H1027875 A | 1/1998 |
| JP | H10027875 A | 1/1998 |
| JP | 2006-216993 A | 8/2006 |
| JP | 4892033 B2 | 3/2012 |
| JP | 2014-116499 A | 6/2014 |
| JP | 2014-123614 A | 7/2014 |
| JP | 2015-191990 A | 11/2015 |
| JP | 2018-163962 A | 10/2018 |
| WO | 2017/169485 A1 | 10/2017 |

OTHER PUBLICATIONS

First Office Action mailed Sep. 7, 2024 in Chinese Patent Application No. 202110646522.9 with machine translation, 21 pages.

* cited by examiner

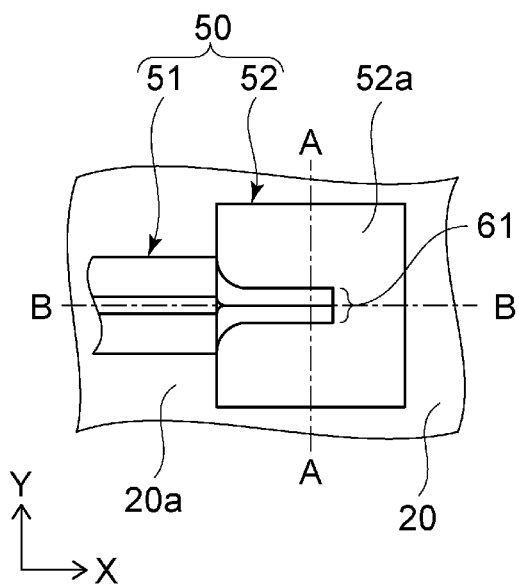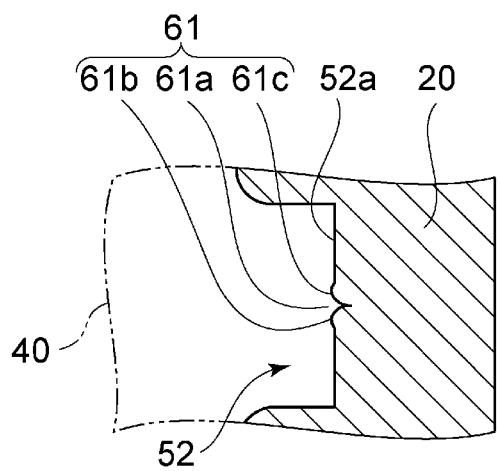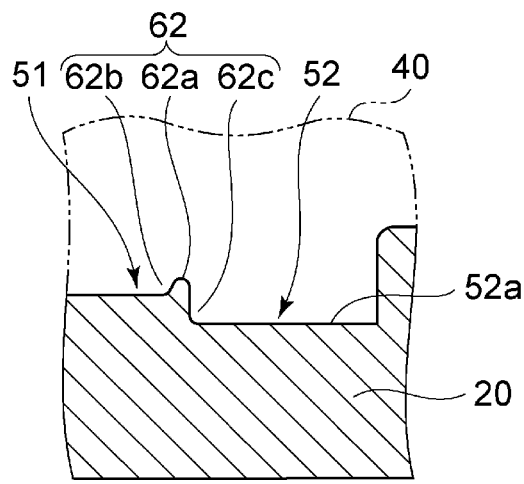

SEMICONDUCTOR DEVICE WITH GROOVED DIE PAD

CROSS-REFERENCE TO RELATED APPLICATION

This application is based upon and claims the benefit of priority from Japanese Patent Application No. 2021-042330, filed Ma. 16, 2021, the entire contents of which are incorporated herein by reference.

FIELD

Embodiments described herein relate generally to a semiconductor device.

BACKGROUND

There is a semiconductor device configured to attain an improvement in adhesiveness between the semiconductor device and a sealing resin by forming a groove in a frame of the device. However, depending on combinations of types of resins and designs of products, the adhesiveness between the frame and a resin may still be insufficient, thus affecting quality assurance for using the semiconductor device for in-vehicle equipment or the like.

BRIEF DESCRIPTION OF THE DRAWINGS

FIG. 2A is a schematic top view of a groove according to a first embodiment.

FIG. 2B is a cross-sectional view taken along line A-A illustrated in FIG. 2A.

FIG. 2C is a cross-sectional view taken along line B-B illustrated in FIG. 2A.

DETAILED DESCRIPTION

Figure 1:
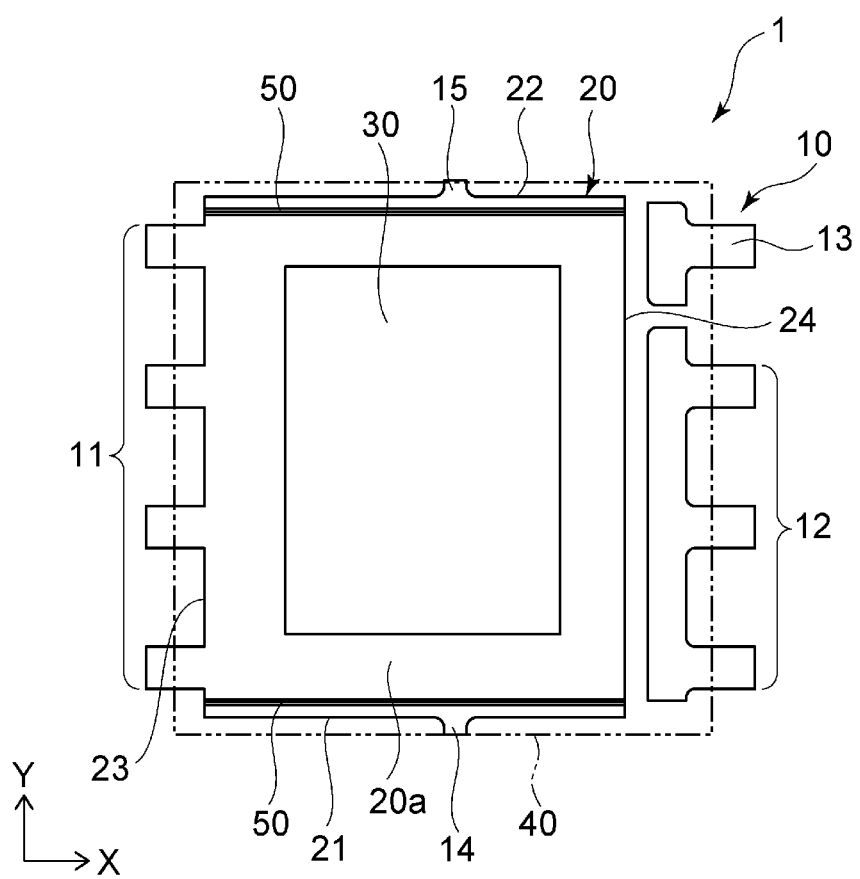
FIG. 1 is a schematic top view of a semiconductor device according to an embodiment.

Embodiments provide a semiconductor device which is configured for increased adhesiveness between a frame member and a resin.

In general, according to one embodiment, a semiconductor device includes a frame including a die pad, terminals extending from the die pad in a first direction, and a groove extending in the first direction on an upper surface of the die pad. A semiconductor element is arranged on the upper surface of the die pad but does not overlap the groove. A resin material covers the semiconductor element and is in the groove. The groove includes a bottom surface, and a first irregularity is in the bottom surface.

Hereinafter, certain example embodiments of the present disclosure will be described with reference to the drawings. In the drawings, the same components are assigned the same reference characters.

FIG. 1 is a schematic top view of a semiconductor device 1 according to an embodiment.

The semiconductor device 1 includes a frame 10, a semiconductor element 30, and a resin member 40. In FIG. 1, for easy understanding of a description about an internal structure of the semiconductor device 1, only an outline of the resin member 40 is illustrated (with a dashed-two dotted line).

The frame 10 includes a die pad 20 and first terminals 11, second terminals 12, and at least one third terminal 13. The terminals 11 to 13 extend away from the die pad 20. The frame 10 is made from a metallic material, such as copper (Cu). Frame 10 may be referred to as a lead frame portion or the like in some instances.

The planar shape of the die pad 20 is, for example, a quadrangular shape having four side portions 21, 22, 23, 24. These side portions include a pair of side portions 21 and 22, which extend in a first direction X, and a pair of side portions 23 and 24, which extend in a second direction Y perpendicular to the first direction X.

The first terminals 11 protrude from the side portion 23 of the die pad 20. The first terminals 11 are provided integrally with the die pad 20.

The second terminals 12 and the third terminal 13 are located in such a way as to face the side portion 24 of the die pad 20 with a slight gap therebetween. The side portion 24 is opposite to the side portion 23 on which the first terminals 11 are provided. The second terminals 12 and the third terminal 13 protrude in a direction opposite to the direction in which the first terminals 11 protrude. The second terminals 12 and the third terminal 13 are separated from the die pad 20. The second terminals 12 are provided integrally with each other. The second terminals 12 and the third terminal 13 are separated from each other.

The frame 10 is cut out from a lead frame in which a plurality of frames is integrally continuous with each other. Frames adjacent in the second direction Y are joined to each other by one of the joining portions 14 and 15, and cutting the joining portions 14 and 15 causes to the frame 10 to be separated from another frame in the second direction Y. Parts of the joining portions 14 and 15 obtained by the above-mentioned cutting-off respectively remain, as protuberances, at the side portions 21 and 22 extending in the first direction X of the frame 10.

Moreover, a plurality of frames are joined to each other via the first to third terminals 11 to 13 in the first direction X, and cutting off the first to third terminals 11 to 13 leads to the frame 10 being separated from another frame in the first direction X.

A groove 50 is provided in the upper surface of the die pad 20. For example, two grooves 50, which both extend in the first direction X, are located spaced away from each other in the second direction Y. The grooves 50 are respectively provided near the side portions 21 and 22 extending along the first direction X of the die pad 20. For example, one end of each of the grooves 50 reaches the side portion 23 and the other end thereof reaches the side portion 24.

The semiconductor element 30 is arranged in a region which does not overlap the grooves 50 formed in the upper surface 20a of the die pad 20. The semiconductor element 30 is thus located in between the two grooves 50 in the second direction Y. The semiconductor element 30 is joined to the upper surface 20a of the die pad 20 by, for example, a joining material such as solder. Element electrodes are formed on the upper surface of the semiconductor element 30, and the element electrodes are electrically connected to the terminals 12 and 13 by, for example, metallic plates made from, for example, Cu. In some examples, the element electrodes and the terminals 12 and 13 may be interconnected by metallic wires (e.g., bonding wires).

The resin member 40 covers at least the upper surface 20a of the die pad 20 and the semiconductor element 30. The resin member 40 is also provided in each of the grooves 50. Also a part of each of the first to third terminals 11 to 13 is covered by the resin member 40 and another part of the first to third terminals 11 to 13 extends outward from the resin member 40.

For example, a portion at the forefront side of each of the joining portions 14 and 15 somewhat protrudes from the side surface of the resin member 40. Most of the surfaces (upper surface, lower surface, and side surfaces) other than the end surface of each of the joining portions 14 and 15 are covered with the resin member 40, and the end surface of each of the joining portions 14 and 15 is exposed from the resin member 40.

First Embodiment

FIG. 2A is a schematic top view of a groove 50 according to a first embodiment, FIG. 2B is a cross-sectional view taken along line A-A illustrated in FIG. 2A, and FIG. 2C is a cross-sectional view taken along line B-B illustrated in FIG. 2A. In FIGS. 2B and 2C, as with FIG. 1, the resin member 40 is illustrated with a dashed-two dotted line.

The groove 50 includes a first groove portion 51 and a second groove portion 52. The first groove portion 51 extends lengthwise in the first direction X, and the second groove portion 52 is formed by crushing a part of the first groove portion 51 as described below.

The second groove portion 52 is larger in width (a width in the second direction Y) than the first groove portion 51, but is continuous with the first groove portion 51 in the first direction X. The depth of the second groove portion 52 is greater than the depth of the first groove portion 51. A first irregularity 61 is provided in the bottom surface 52a of the second groove portion 52. The first irregularity 61 includes a recessed portion 61a and raised portions 61b and 61c. A second irregularity 62 is provided at the boundary between the first groove portion 51 and the second groove portion 52 in the first direction X. The second irregularity 62 includes a raised portion 62a and recessed portions 62b and 62c.

For example, the second groove portion 52 is located at least at one of the first direction X ends of the first groove portion 51, and, preferably, at both ends thereof. Accordingly, in FIG. 1, a second groove portion 52 is located at each of the four corners of the quadrangular die pad 20. Moreover, in some examples, a second groove portion 52 may additionally or instead be located at a middle portion along the first direction X of the first groove portion 51.

Next, a method of forming the groove 50 according to the first embodiment is described with reference to FIGS. 3A and 3B to FIGS. 5A and 5B.

Figure 3A:
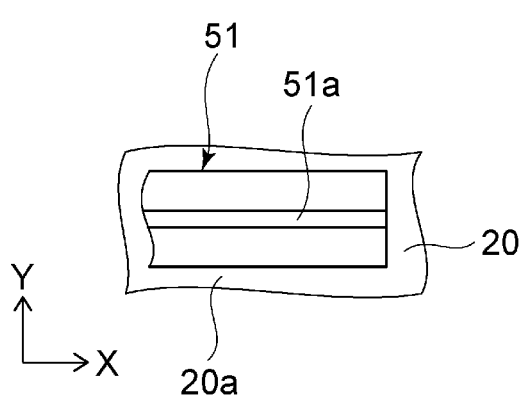
FIGS. 3A and 3B are schematic views illustrating aspects related to a method of forming a groove according to a first embodiment.
Figure 3B:
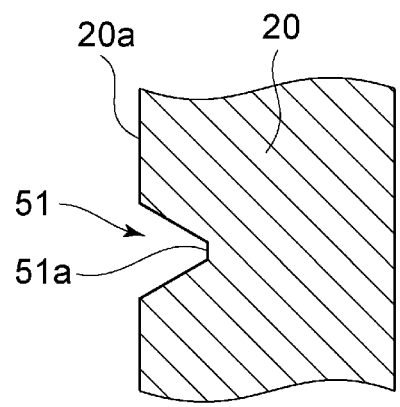

First, as illustrated in FIGS. 3A and 3B, the first groove portion 51 is formed by pressing a mold tool or the like against the upper surface 20a of the die pad 20. FIG. 3A is a top view of the same region as that illustrated in FIG. 2A, and FIG. 3B is a cross-sectional view of the same region as that illustrated in FIG. 2B.

For example, the first groove portion 51 is formed into the shape of letter "V" in cross section having sloping surfaces each making an obtuse angle with the upper surface 20a of the die pad 20. Alternatively, the first groove portion 51 maybe formed with a concave shape in cross section having side surfaces substantially perpendicular to the upper surface 20a of the die pad 20. In any event, the first groove portion 51 includes a flat bottom surface 51a. The method used for forming the first groove portion 51 may be by using etching instead of or in addition to pressing.

Figure 4A:
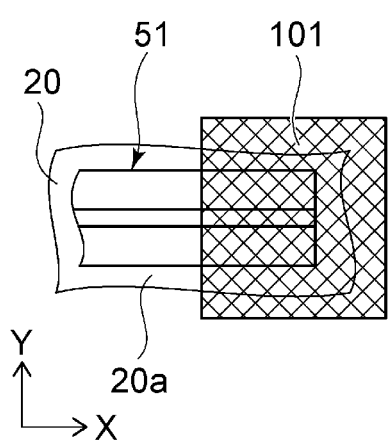
FIGS. 4A and 4B are schematic views illustrating aspects related to a method of forming a groove according to a first embodiment.
Figure 4B:
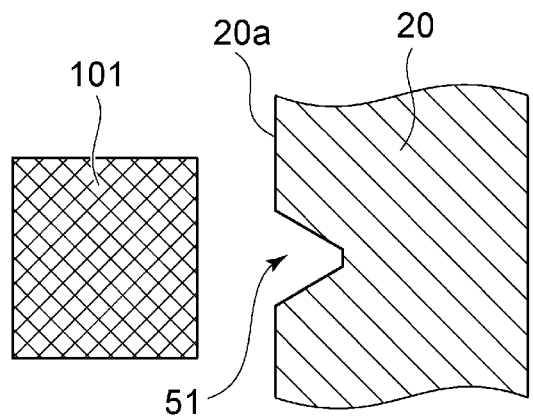

FIG. 4A is a top view illustrating a process following the process illustrated in FIG. 3A, and FIG. 4B is a cross-sectional view illustrating a process following the process illustrated in FIG. 3B. After forming the first groove portion 51, as illustrated in FIGS. 4A and 4B, a mold tool 101 is superimposed on a part (e.g., an end part) of the first groove portion 51.

Figure 5A:
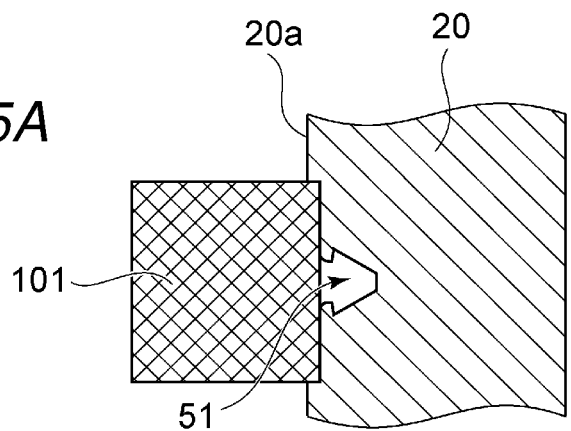
FIGS. 5A and 5B are schematic views illustrating aspects related to a method of forming a groove according to a first embodiment.
Figure 5B:
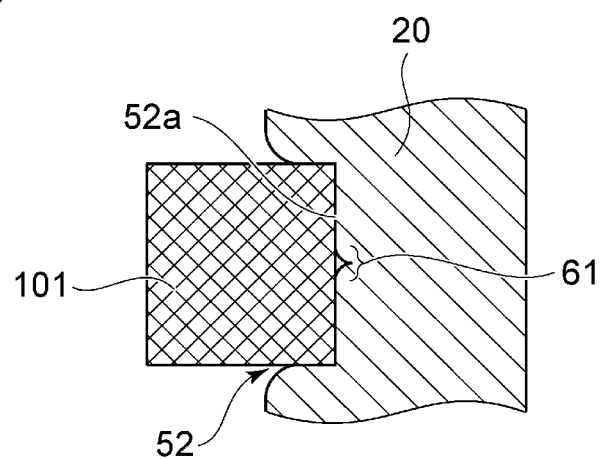

FIG. 5A is a cross-sectional view illustrating a process following the process illustrated in FIG. 4B, and FIG. 5B is a cross-sectional view illustrating a process following the process illustrated in FIG. 5A.

Then, as illustrated in FIG. 5A, the mold tool 101 is pressed against the upper surface 20a of the die pad 20 to push a portion of the upper surface 20a surrounding the first groove portion 51 downward. Along with this pushing/pressing, the first groove portion 51 begins to be crushed with its initial cross-sectional shape being deformed.

As illustrated in FIG. 5B, further pushing of the portion of the upper surface 20a of the die pad 20 by the mold tool 101 further crushes the first groove portion 51. This results in the second groove portion 52 being formed as illustrated in FIGS. 2A to 2C. A surface of the die pad 20 against which the mold tool 101 has been pressed becomes a bottom surface 52a of the second groove portion 52, and the first irregularity 61 is formed at the bottom surface 52a. By not crushing just a flat surface but rather crushing a portion of the previously formed first groove portion 51 enables the forming of the first irregularity 61 at the bottom surface 52a of the second groove portion 52.

Moreover, as illustrated in FIG. 2C, the method crushes the first groove portion 51 using the mold tool 101 in such a manner that the second groove portion 52 actually becomes deeper than the first groove portion 51, thus simultaneously forming the second irregularity 62 at the boundary between the first groove portion 51 and the second groove portion 52.

Furthermore, depending on shapes of the first groove portion 51 and/or shape of the mold tool 101, even if the depth of the second groove portion 52 is set equal to the depth of the first groove portion 51 or less than the depth of the first groove portion 51, an irregularity may still be formed at the boundary between the first groove portion 51 and the second groove portion 52. However, by setting the second groove portion 52 to be deeper than the first groove portion 51 this enables more surely forming of the irregularity at the boundary between the first groove portion 51 and the second groove portion 52.

As a result of an anchor effect (anchoring effect) caused by the presence of the first irregularity 61 and the second irregularity 62, the adherence between the frame 10 and the resin member 40 is increased, so that it is possible to prevent or reduce chances of the resin member 40 becoming detached from the frame 10. This helps in preventing defects such as caused by moisture intruding into any gap formed or generated between the resin member 40 and the frame 10, thus improving device quality and lifetime which may be required for a device to be used in, for example, in-vehicle equipment.

To more effectively prevent or reduce the resin member 40 from becoming detached from the frame 10, it is typically desirable to arrange a second groove portion 52 at each of the four corners of the die pad 20. Moreover, since the frame 10 is cut out after the resin member 40 is formed on the frame 10, stress is likely to be locally applied to the vicinity of each of the joining portions 14 and 15. Therefore, arranging the second groove portion 52 at the vicinity of each of the joining portions 14 and 15 (for example, at positions respectively facing the joining portions 14 and 15) can also be effective for preventing the resin member 40 from becoming detached from the frame 10.

Moreover, in the case of joining the semiconductor element 30 to the upper surface 20a of the die pad 20 by soldering, the first irregularity 61 and the second irregularity 62 provide a function of preventing solder from flowing off the upper surface 20a.

Second Embodiment

Figure 6A:
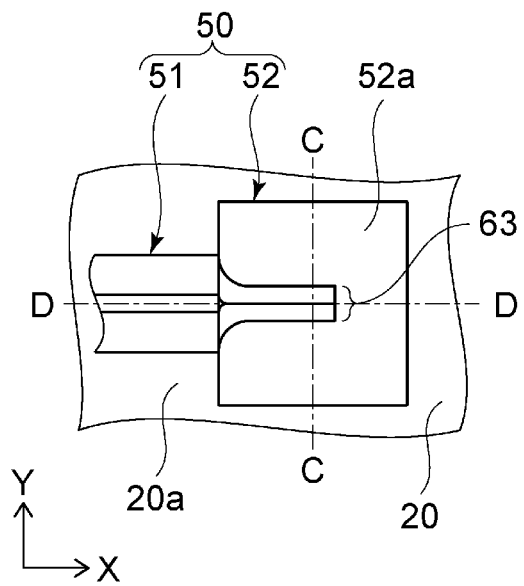
FIG. 6A is a schematic top view of a groove according to a second embodiment.
Figure 6B:
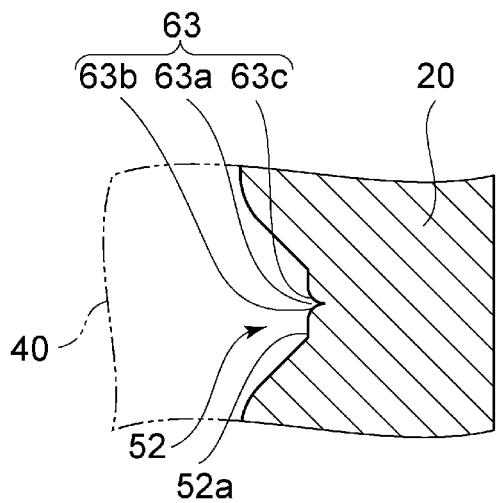
FIG. 6B is a cross-sectional view taken along line C-C illustrated in FIG. 6A.
Figure 6C:
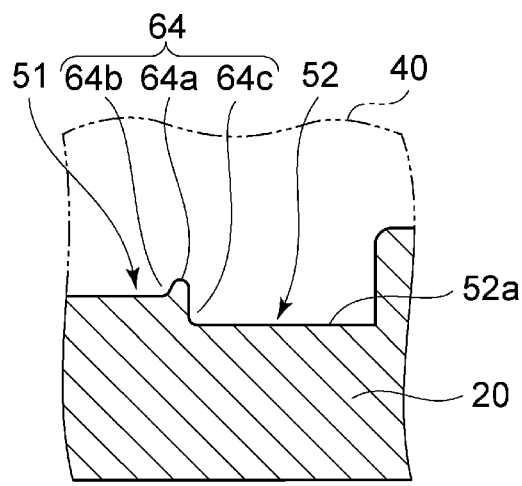
FIG. 6C is a cross-sectional view taken along line D-D illustrated in FIG. 6A.

FIG. 6A is a schematic top view of a groove 50 according to a second embodiment, FIG. 6B is a cross-sectional view taken along line C-C illustrated in FIG. 6A, and FIG. 6C is a cross-sectional view taken along line D-D illustrated in FIG. 6A. In FIGS. 6B and 6C, as with FIG. 1, the resin member 40 is again illustrated with a dashed-two dotted line.

In the second embodiment, the groove 50 still includes a first groove portion 51 and a second groove portion 52. The second groove portion 52 is again larger in width (a width in the second direction Y) than the first groove portion 51, and is continuous with the first groove portion 51 in the first direction X. The depth of the second groove portion 52 is also greater than the depth of the first groove portion 51. A first irregularity 63 (rather than a first irregularity 61) is provided in the bottom surface 52a of the second groove portion 52. The first irregularity 63 includes a recessed portion 63a and raised portions 63b and 63c. A second irregularity 64 (rather than a second irregularity 62) is provided at a boundary between the first groove portion 51 and the second groove portion 52 in the first direction X. The second irregularity 64 includes a raised portion 64a and recessed portions 64b and 64c.

In the second embodiment, as with the first embodiment, the method of forming the groove 50 includes first forming the first groove portion 51 and then crushing a part of the first groove portion 51 using a mold tool for forming the second groove portion 52.

Figure 7A:
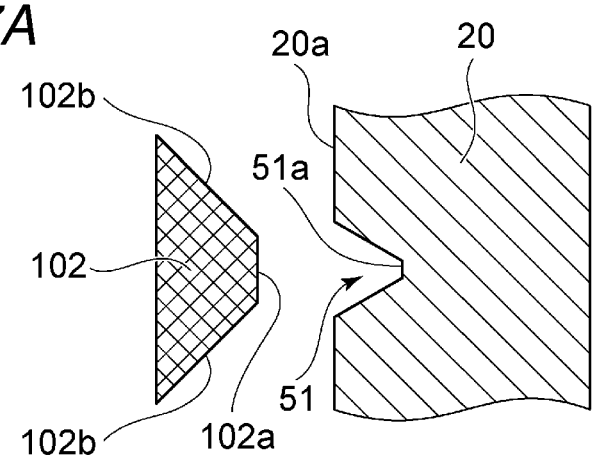
FIGS. 7A, 7B, and 7C are schematic views illustrating aspects related to a method of forming a groove according to a second embodiment.

FIG. 7A is a cross-sectional view of the same region as that illustrated in FIG. 6B. After forming the first groove portion 51, as illustrated in FIG. 7A, the mold tool 102 is superimposed on apart of the first groove portion 51. The mold tool 102 includes a forefront surface 102a and a slanting side surface 102b making an obtuse angle with the forefront surface 102a.

Figure 7B:
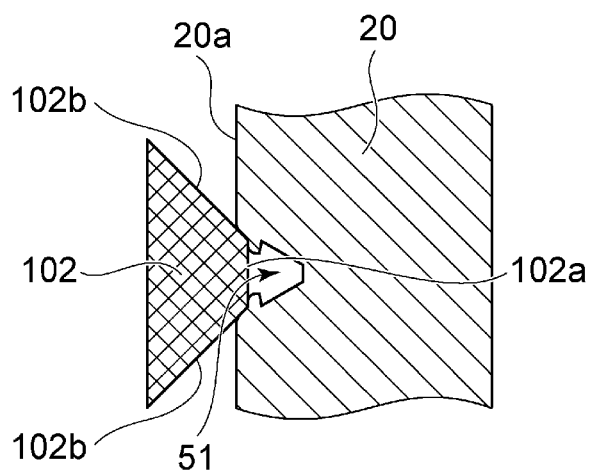
Figure 7C:
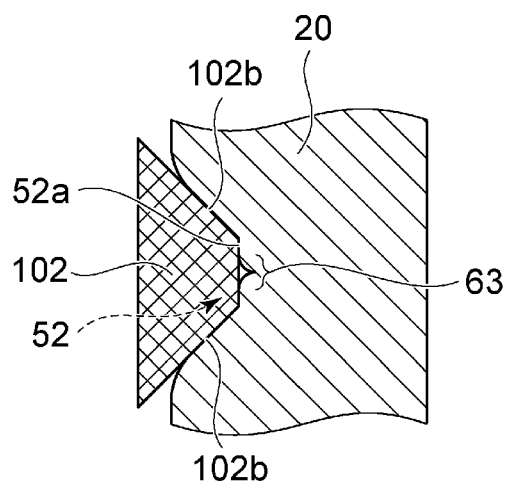

FIG. 7B is a sectional view illustrating a process following the process illustrated in FIG. 7A, and FIG. 7C is a sectional view illustrating a process following the process illustrated in FIG. 7B.

Then, as illustrated in FIG. 7B, the forefront surface 102a of the mold tool 102 is pressed against the upper surface 20a of the die pad 20 to push a portion of the upper surface 20a surrounding the first groove portion 51 downward. Along with this pushing, the pressed portion of the first groove portion 51 begins to be crushed with the cross-sectional shape thereof being deformed.

As illustrated in FIG. 7C, the method involves further pushing the upper surface 20a of the die pad 20 with the mold tool 102 to further crush the first groove portion 51. This results in the second groove portion 52 being formed as illustrated in FIGS. 6A to 6C. A surface of the die pad 20 against which the forefront surface 102a of the mold tool 102 has been pressed becomes a bottom surface 52a of the second groove portion 52, and the first irregularity 63 is formed at the bottom surface 52a. By not crushing just a flat surface but rather crushing a portion of the already-formed first groove portion 51, the first irregularity 63 can be formed at the bottom surface 52a of the second groove portion 52.

A surface of the die pad 20 against which the slanting side surface 102b of the mold tool 102 has been pressed becomes a side surface of the second groove portion 52. The side surface of the second groove portion 52 becomes a side surface slanting with respect to the bottom surface 52a in conformity with the shape of the slanting side surface 102b of the mold tool 102.

Moreover, as illustrated in FIG. 6C, the first groove portion 51 is crushed by the mold tool 102 in such a manner that the second groove portion 52 is deeper than the first groove portion 51, thus forming the second irregularity 64 at the boundary between the first groove portion 51 and the second groove portion 52.

In the second embodiment, as a result of an anchor effect caused by the first irregularity 63 and the second irregularity 64, the adhesiveness between the frame 10 and the resin member 40 is increased, so that it is possible to prevent the resin member 40 from becoming detached from the frame 10.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
  a frame including a die pad and terminals extending away from the die pad in a first direction;
  a groove in an upper surface of the die pad, the groove extending lengthwise in the first direction and including a first groove portion and a second groove portion adjacent to each other in the first direction, the first groove portion being continuous with the second groove portion in the first direction;
  a semiconductor element on the upper surface of the die pad but not overlapping the groove; and
  a resin material in the groove and covering the semiconductor element, wherein the groove has a bottom surface and a first irregularity is formed in the bottom surface,
  the second groove portion has a width in a second direction perpendicular to the first direction that is greater than a width of the first groove portion,
  the length of the first groove portion in the first direction is greater than the length of the second groove portion in the first direction;

the groove is proximate to an outer edge of the die pad, the outer edge extending in the first direction, and the groove extends the entire length of the die pad in the first direction.

2. The semiconductor device according to claim 1, wherein the bottom surface of the groove includes a substantially flat portion, and the first irregularity is a recess extending into the die pad to a depth greater than the bottom surface.

3. The semiconductor device according to claim 1, wherein the first irregularity extends less than the entire length of the die pad.

4. The semiconductor device according to claim 3, wherein the first irregularity extends to an outer edge of the die pad that extends in the second direction.

5. The semiconductor device according to claim 1, wherein the die pad is rectangular shaped.

6. The semiconductor device according to claim 1, wherein the frame is copper.

7. The semiconductor device according to claim 1, wherein the first irregularity is in the bottom surface of the second groove portion but not in the bottom surface of the first groove portion.

8. The semiconductor device according to claim 1, wherein the groove further includes a second irregularity at a boundary between the first groove portion and the second groove portion.

9. The semiconductor device according to claim 8, wherein the second irregularity is a protrusion extending upward from the bottom surfaces of the first and second groove portions, and the protrusion extends in the second direction between sidewalls of the groove.

10. The semiconductor device according to claim 1, wherein a depth of the second groove portion is greater than a depth of the first groove portion.

11. The semiconductor device according to claim 1, wherein the second groove portion is at an end of the groove in the first direction.

12. The semiconductor device according to claim 1, wherein the second groove portion is located at a middle portion of groove along the first direction.

13. The semiconductor device according to claim 1, wherein the second groove portion is at both ends of the groove in the first direction.

14. The semiconductor device according to claim 1, wherein the second groove portion has angled sidewalls that form an oblique angle with bottom surface.

* * * * *